United States Patent [19]
Bryant

[11] Patent Number: 5,984,593
[45] Date of Patent: *Nov. 16, 1999

[54] CUTTING INSERT FOR MILLING TITANIUM AND TITANIUM ALLOYS

[75] Inventor: William A. Bryant, Elizabeth Township, Pa.

[73] Assignee: Kennametal Inc., Latrobe, Pa.

[ * ] Notice: This patent is subject to a terminal disclaimer.

[21] Appl. No.: 08/820,449

[22] Filed: Mar. 12, 1997

[51] Int. Cl.⁶ .................................................. C23C 14/06
[52] U.S. Cl. .......................................... 407/119; 407/118
[58] Field of Search .................................. 407/119, 118, 407/113; 51/295, 307, 309; 428/217, 698, 697, 699; 76/DIG. 11; 148/425; 75/203

[56] References Cited

U.S. PATENT DOCUMENTS

| | | | |
|---|---|---|---|
| 4,437,800 | 3/1984 | Araki et al. | 407/119 |
| 4,583,431 | 4/1986 | Komanduri et al. | 82/1 C |
| 4,590,031 | 5/1986 | Eichen et al. | 264/338 |
| 4,652,183 | 3/1987 | Veltri et al. | 407/119 |
| 4,698,266 | 10/1987 | Buljan | 428/457 |
| 4,716,083 | 12/1987 | Eichen et al. | 428/457 |
| 4,828,584 | 5/1989 | Cutler | 51/307 |
| 4,933,058 | 6/1990 | Bache et al. | 204/192.3 |
| 4,942,062 | 7/1990 | Ducarroir et al. | 427/249 |
| 4,984,940 | 1/1991 | Bryant et al. | 407/119 |
| 5,011,514 | 4/1991 | Cho et al. | 51/295 |
| 5,038,645 | 8/1991 | Walter et al. | 82/1.11 |
| 5,066,553 | 11/1991 | Yoshimura et al. | 407/119 X |
| 5,106,674 | 4/1992 | Okada et al. | 407/119 X |
| 5,131,481 | 7/1992 | Smith | 407/119 X |
| 5,145,739 | 9/1992 | Sarin | 428/336 |
| 5,173,328 | 12/1992 | Reiter et al. | 427/576 |
| 5,183,362 | 2/1993 | Kuroyama et al. | 407/118 |
| 5,193,948 | 3/1993 | Noggle | 407/116 |
| 5,279,866 | 1/1994 | Bourget et al. | 427/575 |
| 5,292,417 | 3/1994 | Kugler et al. | 204/192.13 |
| 5,325,747 | 7/1994 | Santhanam et al. | 82/1.11 |
| 5,405,448 | 4/1995 | Jost et al. | 118/723 E |
| 5,413,684 | 5/1995 | Bergmann | 204/192.13 |
| 5,415,756 | 5/1995 | Wolfe et al. | 204/192.23 |
| 5,418,003 | 5/1995 | Bruce et al. | 427/126.2 |
| 5,421,891 | 6/1995 | Campbell et al. | 118/723 R |
| 5,427,665 | 6/1995 | Hartig et al. | 204/192.12 |
| 5,443,337 | 8/1995 | Katayama | 407/118 |
| 5,626,909 | 5/1997 | Iacovangelo | 407/119 |
| 5,718,541 | 2/1998 | Bryant | 407/118 |

FOREIGN PATENT DOCUMENTS

| | | |
|---|---|---|
| 1284030 | 6/1972 | European Pat. Off. . |
| 1540718 | 3/1979 | European Pat. Off. . |
| 0328084 | 2/1989 | European Pat. Off. . |
| 0328084 A2 | 8/1989 | European Pat. Off. . |
| 3841730 A1 | 6/1990 | Germany . |
| 73392 | 6/1979 | Japan . |
| 1394108 | 11/1972 | United Kingdom . |
| 1540718 | 3/1975 | United Kingdom . |
| 2123039 | 3/1984 | United Kingdom . |
| 2179678 | 11/1987 | United Kingdom . |
| 2308133 | 6/1997 | United Kingdom . |
| 2308133 A2 | 6/1997 | United Kingdom . |
| WO 9200848A1 | 1/1992 | WIPO . |
| WO 9205296A1 | 4/1992 | WIPO . |

OTHER PUBLICATIONS

D. Mari et al., "A New Look at Carbide Tool Life" Wear, 165 (1993) pp. 9–17.

Zlatin et al., "Procedures and Precautions in Machining Titanium Alloys", Titanium Sci. & Tech., vol. 1. (1973) pp. 489–504.

(List continued on next page.)

*Primary Examiner*—Daniel W. Howell
*Assistant Examiner*—Mark Williams
*Attorney, Agent, or Firm*—John J. Prizzi; Stanislav Antolin

[57] ABSTRACT

A cutting tool for milling titanium and titanium alloys which includes a substrate that comprises tungsten carbide and cobalt. The substrate further includes cobalt in the range of between 5.7 to 6.3 weight percent and chromium in the range of between 0.3 and 0.5 weight percent. The cutting tool has a coating of tungsten carbide applied to the substrate by physical vapor deposition.

20 Claims, 1 Drawing Sheet

OTHER PUBLICATIONS

Konig et al. "Applied Research on the Machinability of Titanium and its Alloys", Proc. AGARD Cont. Advanced Fabrication Processes (1978), pp. 1–1 through 1–10.

Komanduri et al. "New Observations on the Mechanism of Chip formation when Machining Titanium Alloys", Wear, 69 (1981), pp. 179–188.

Christopher, "Trends in cutting Tool Materials", 1981 Int'l Conf. on Trends in Conventional and Non–Traditional Machining (1981) The Society of Carbide and Tool Engineers, pp. 195 and 211.

Jensen, "High Speed Machining of Titanium", Master of Science Theses at MIT ((1984) pp. 1–151.

Lehtihet, "Face Milling Tool Geometry and Cutting Performance of Silicon Nitride Tool Materials", Ph.D. Dissertation at Lehigh University (185), p. 123.

Trucks, "Machining Titanium Alloys", Machine and Tool Blue Book (1987), pp. 39–41.

Min et al. "Diffusion Wear in Milling Titanium Alloys", Materials Science and Technology, vol. 4 (1988), pp. 548–553.

Bhattacharyya et al. "The Milling of Titanium with Coated Carbide Tools", Annals of the 8th CBECIMAT Unicamp, Campinas Spain (1988), pp. 271–275.

Chandrasekaran et al. "Role of Tool Microstructure and Stress–State upon the Wear Mechanisms in Milling", Annals of the CIRP, vol. 39 (1990), pp. 65–69.

Metals Handbook Ninth Edition, vol. 16, Machining (1989), pp. 602–606.

Chandler, "Machining of Reactive Metals", Metals Handbook Ninth Edition, vol. 16, Machining (1989), pp. 844–857.

Kennametal Tooling Applications Program Brochure, Kennametal Inc. Latrobe Pennsylvania (1990), pp. 3, 39–43.

Gettlemen et al. "Think Positive!", Modern Machine Shop (Oct. 1990), pp. 57–64.

Szyp, "Milling: Pushing Carbide to the Edge", Tool & Production (May 199), pp. 60–66.

Dillon et al. "The Effects of Temperature on the Machining of Metals", J. Materials Shaping Tech. vol. 8, No. 1 (1990), pp. 23–29.

Coll et al. "(Ti–Al)N Advanced Film Prepared by Arc Process", Materials Science and Engineering A140 (1991), pp. 816–824.

"Tooling Up for Exotic Cutting", Aircraft Engineering (May 1991) pp. 6 and 12.

"Tips for Aerospace Machining", Manufacturing Engineering (Mar. 1993), pp. 67–69.

Eckstein et al. "Face–Cut Milling of Titanium Alloys at High Cutting Rates", Verein Deutscher Ingenieure Zeitschrift 133 (12) (1991), pp. 28–31, 34 (English translation).

Ezugwu et al. "Face Milling of Aerospace Materials", First Int'l Conf. on the Behavior of Materials in Machining, Stratford–upon–Avon, England (1988), Paper No. 3 (Institute of Metals) pp. 3.1 to 3.11.

Negishi et al. "Study of Tool Failure of Carbide Tools in Interrupted Turning", Annals of the CIRP vol. 30, No. 1 (1981), pp. 43–46.

Handbook of High Temperature Compounds: properties, Production, Applications, Kosolapova Editor, Hemisphere Pub. Crop. pp. 530, 557, 574.

Cook et al. "The Thermal Mechanisms of Tool Wear", J. of Engineering for Industry, Feb. 1966, pp. 93–100.

Kennametal Brochure entitled "Tools, Tooling Systems and Services for the Global Metalworking Industry" (1991), pp. 1, 2, and 274.

Siekmann, "How to Machine Titanium", The Tool Engineer, Jan. 1955, pp. 78–82.

Israelsson, "Turning Inserts TTTake Off", Cutting Tool Engineering, Sep. 1993, pp. 36 & 38–40.

Chandler, "Machining of Reactive Metals", Metals Handbook, vol. 16, 9th Ed., pp. 844–857.

Machado et al. "Machining of Titanium and Its Alloys—A Review", Proc. Inst. Mech. Engrs. vol. 204 (1990), pp. 53–60.

Olsson et al. "Chemical Vapour Deposition of Boron Carbides on Uncoated and TiC–Coated Cemented Carbide substrates", Surface & Coatings Tech, 42 (1990), pp. 187–201.

Jansson, "Chemical Vapor Deposition of Boron Carbides", Mat'ls & Mfg. Processes, vol. 6, No. 3 (1991), pp. 481–500.

Hartung et al. "Tool Wear in Titanium Machining", Annals of CIRP, vol. 31, No. 1 (1982), pp. 75–80.

Narutaki et al. "Study on Machining Titanium Alloys", Annals of CIRP, vol. 32, No. 1 (1983), pp. 65–69.

Peterson et al. "Coatings for Tribological Applications", Fundamentals of Friction and Wear—1980 ASM Seminar, pp. 331–372.

Kossowsky et al. "Friction and Wear" Surface Modification Engineering, vol. 1, CRC Press Inc., pp. 145–185.

Meyers et al. "Mechanical Metallurgy", Prentice Hall Inc., pp. 600–624.

Backofen, Deformation Processing, Addision–Wesley Pub. Co. pp. 174–175.

Rabonowicz, Friction and Wear of Materials, John Wiley & sons, pp. 10–31.

Dearnley et al. "Evaluation of Principal Wear Mechanisms of Cemented Carbides and Ceramics Used for Machining Titanium Alloy IMI 318", Mat'ls Science & tech., Jan. 1986 vol. 2, pp. 47–58.

Dearnley et al. "Wear Mechanisms of Cemented Carbides and Ceramic Used for Machining Titanium Alloys", High Tech Ceramics, Elsevier Science Publishers (1987), pp. 2269–2712.

Mari et al. "A New Look at Carbide Tool Life", Wear 165 (1993), pp. 9–17.

CUTTING INSERT FOR MILLING TITANIUM AND TITANIUM ALLOYS

BACKGROUND

Titanium metal and many of its alloys (e.g., Ti-6Al-2Zr-2Mo and Ti-6Al-4V) present a high strength-weight ratio which is maintained at high temperatures. Titanium metal and its alloys also have exceptional corrosion resistance. These characteristics are very desirable and have been the principal cause for the rapid growth of the titanium industry from the 1950's to the present. The aerospace industry has been the major consumer of titanium and titanium alloys for use in airframes and engine components. Non-aerospace applications include medical components, steam turbine blades, superconductors, missiles, submarine hulls, chemical apparatus, and other products where corrosion is a concern.

Titanium and titanium alloys possess physical properties which make these materials difficult to mill. Hence, cutting inserts used to mill these materials face special challenges which require the careful selection of the appropriate cutting insert.

In milling, there are repeated mechanical shocks due to the interrupted nature of the process. The mechanical shock may also produce cracks that result in microchipping of the cutting edge of the cutting insert.

The interrupted cutting process of the milling operation also causes thermal shocks since the cutting insert repeatedly heats up when in contact with the workpiece and cools down when removed from contact with the workpiece. In the milling of titanium and its alloys the magnitude of these thermal shocks is especially severe because of the typically high temperatures, and the accompanying large temperature differential between the high temperature and the low temperature of the cutting insert associated with a milling operation. Like with mechanical shock, thermal shock may produce cracks that result in microchipping of the cutting edge of the cutting insert.

Another reason that titanium and its alloys are difficult to mill is that they have a low thermal conductivity which worsens the ability to transfer heat into the workpiece and the chips and away from the cutting insert. This is especially true when one considers that when milling titanium and its alloys the chip travels across a surface of the cutting insert at a relatively fast speed, i.e., at a speed two to three times faster than when machining steel, with only a small area of contact between the chip and the surface of the cutting insert. Such a circumstance produces considerable heat-producing shearing of the chip which results in high temperatures (e.g., about 1093° C. (2000° F.) at the interface between the cutting insert and the chip).

At interface temperatures of about 500° C. (932° F.) and above, which includes 1093° C. (2000° F.), titanium and titanium alloys are typically chemically reactive with the cutting insert material, as well as with the nitrogen and the oxygen in the air. This chemical reactivity typically increases with an increase in temperature so that at high cutting insert-chip interface temperatures such as 1093° C. the titanium workpiece is very reactive with the cutting insert and its surrounding environment.

Because of the high temperatures generated at the cutting insert-chip interface and the highly reactive nature of titanium and its alloys, diffusion of elements of the cutting insert into the chips (of the workpiece material) may cause cratering of the cutting insert.

The cutting insert-chip interface may be under pressures in the order of about 1.38 to 2.07 gigapascal (200,000 psi to 300,000 psi). These high stresses at the cutting edge of the cutting insert may lead to deformation and fracture of the cutting insert.

Thus, it is apparent that a cutting insert for use in milling titanium and its alloys should possess certain physical and mechanical properties which will enable it to address the challenges inherent in the milling of titanium and its alloys. More specifically, the cutting insert should be able to resist mechanical shocks and thermal shocks which are inherent in a milling operation. The cutting insert should be able to withstand the high temperature at the cutting insert-chip interface so as to minimize cratering. The cutting insert should also be able to withstand the high stresses which may lead to deformation, especially at the high operating temperatures associated with milling titanium and its alloys.

SUMMARY

It is an object of the invention to provide a cutting insert which possesses physical and mechanical properties which make it suitable for the milling of titanium and its alloys. These properties should allow the cutting insert to resist mechanical shocks and the thermal shocks which are inherent in a milling operation. The cutting insert should also be able to withstand the high temperature at the cutting insert-chip interface so as to minimize cratering. These cutting inserts should also be able to withstand the high stresses which may lead to deformation.

In one form thereof, the invention is a cutting insert for milling titanium and titanium alloys that comprises a substrate which includes tungsten carbide and cobalt. The substrate further includes cobalt in the range of between 5.7 to 6.3 weight percent and chromium in the range of between 0.3 and 0.5 weight percent. The cutting insert further comprises a coating of tungsten carbide applied to the substrate by physical vapor deposition.

In another form thereof, the invention is a cutting tool for milling titanium and titanium alloys comprising a substrate which includes tungsten carbide and cobalt wherein the cobalt ranges between 5.7 and 6.3 weight percent of the substrate. The cutting tool further includes a tip brazed to the substrate wherein the tip comprises tungsten carbide. The cutting tool also includes a coating of tungsten carbide applied by physical vapor deposition to the tungsten carbide tip. Optionally, a coating of PVD tungsten carbide may also be applied to the substrate or to those portions of the substrate which come into contact with the workpiece during milling.

BRIEF DESCRIPTION OF THE DRAWINGS

The following is a brief description of the drawings that form a part of this patent application.

DETAILED DESCRIPTION OF SPECIFIC EMBODIMENTS

Figure 1:
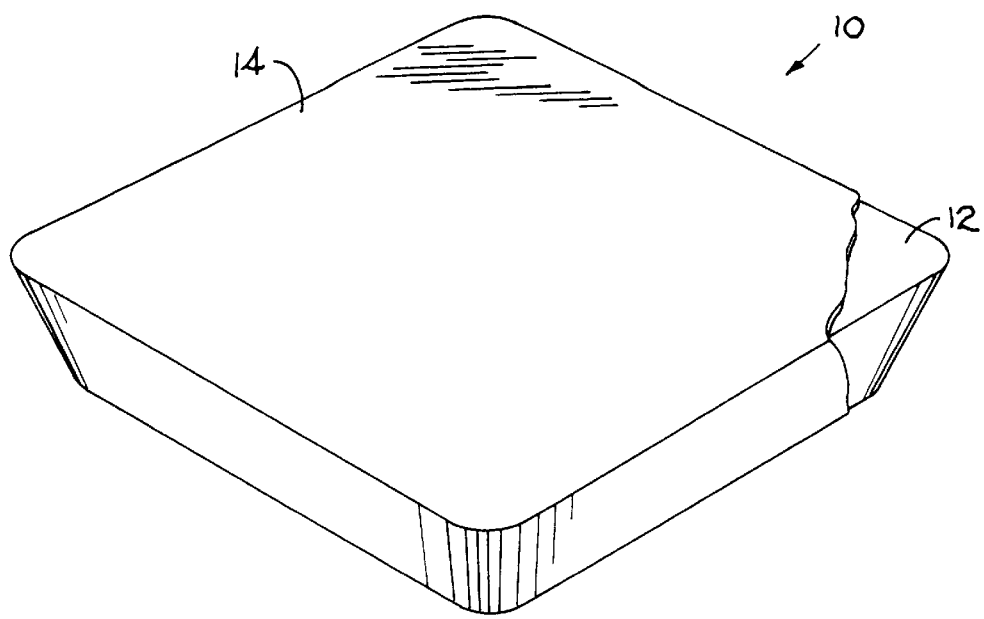
FIG. 1 is a perspective view of a coated cutting insert with a portion of the coating removed from the substrate.

Referring to FIG. 1, the coated cutting insert 10 has a substrate 12. The substrate is a cemented tungsten carbide-cobalt composition sold by Kennametal Inc. of Latrobe, Pa. (assignee of the present patent application). The preferred composition of the substrate comprises constituents and properties within the following ranges: about 5.7 to about 6.3 weight percent cobalt; 0 to about 0.1 weight percent tantalum; 0 to about 0.1 weight percent titanium, 0 to about 0.1 weight percent niobium, about 0.3 to about 0.5 weight percent chromium, and the balance tungsten carbide. Other properties of the preferred substrate include a hardness of between 92.6 and 93.4 Rockwell A, a coercive force of between 250 and 320 oersteds ($H_C$), a specific gravity of 14.80 to 15.00 grams per cubic centimeter (g/cm$^3$), and a WC grain size of 1 to 5 micrometers ($\mu$m). As will become apparent from the discussion hereinafter, the preferred substrate is Grade No. 1 in the discussion below.

The cutting insert 10 further includes a coating 14. Most preferably, the coating is a coating of tungsten carbide (WC) applied by PVD (physical vapor deposition) techniques. These physical vapor deposition techniques include, but are not limited to, ion plating, magnetic sputtering and arc evaporation. In regard to specific PVD processes, applicant considers that the electron beam physical vapor deposition (EB-PVD) technique would be appropriate for the deposition of the tungsten carbide coating. The EB-PVD process is described in U.S. Pat. No. 5,418,003 to Bruce et al. for VAPOR DEPOSITION OF CERAMIC MATERIALS. Applicant also considers that the sputtering method would be suitable for the PVD application of boron carbide and tungsten carbide. U.S. Pat. No. 5,427,665 to Hartig et al. for PROCESS AND APPARATUS FOR REACTIVE COATING OF A SUBSTRATE discloses a sputtering process. U.S. Pat. No. 5,292,417 to Kugler for a METHOD FOR REACTIVE SPUTTER COATING AT LEAST ONE ARTICLE, U.S. Pat. No. 5,413,684 to Bergmann for a METHOD AND APPARATUS FOR REGULATING A DEGREE OF REACTION IN A COATING PROCESS, and U.S. Pat. No. 5,415,756 to Wolfe et al. for an ION ASSISTED DEPOSITION PROCESS INCLUDING REACTIVE SOURCE GASSIFICATION each disclose apparatus and methods that would be suitable or the PVD deposition of tungsten carbide.

Figure 2:
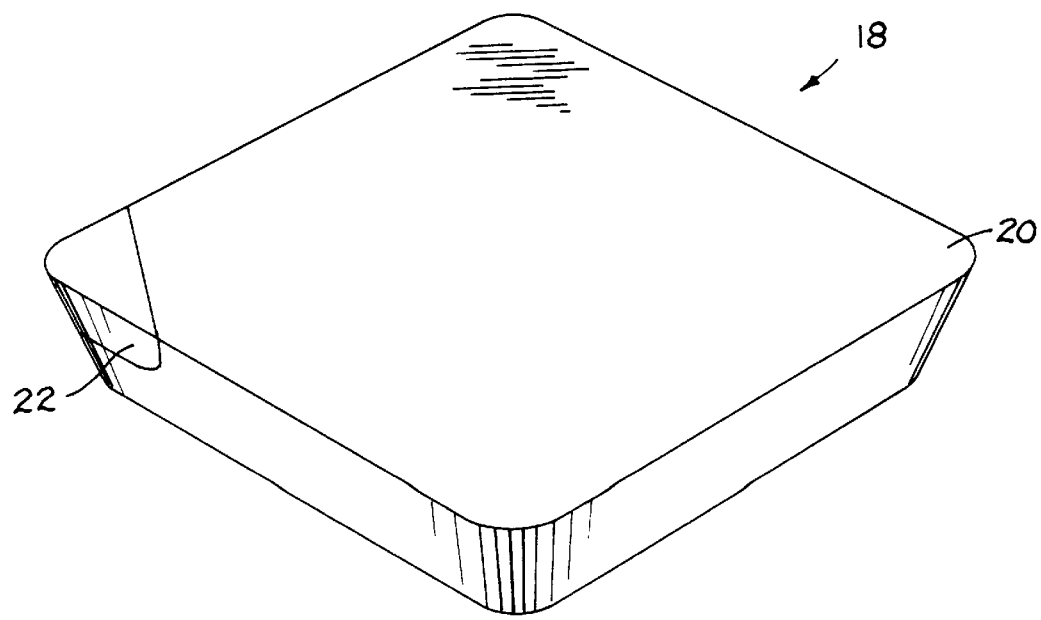
FIG. 2 is a perspective view of a cutting insert with a brazed-on tip.

Referring to FIG. 2, the cutting insert 18 includes a substrate 20 with a brazed-on tip 22. The tip may be made of a cemented tungsten carbide such as, for example, the same material as the substrate of the first specific embodiment. In the alternative the tip may be made of a binderless PVD tungsten carbide body. As another alternative, the tip may be made of binderless tungsten carbide. The tips 22, especially those made from tungsten carbide-cobalt material, preferably include a PVD tungsten carbide coating applied thereto. The PVD coating may be applied either before the tip is brazed to the substrate or after the tip is brazed to the substrate.

Although the substrate 20 may be made from the same material (WC-Co) as the substrate 12 of the first specific embodiment, applicant considers the invention to include other substrates such as, for example, binderless tungsten carbide. The portion of the substrate that comes into contact with the workpiece during milling, or all of the substrate, may have a PVD tungsten carbide coating applied thereto.

There are a number of wear mechanisms that impact upon the tool life of a coated cemented carbide cutting insert used in the milling of titanium and titanium alloys. These wear mechanisms include edge chipping, diffusion wear (or cratering), and deformation.

Edge chipping can be a severe wear mechanism in the milling of titanium and titanium alloys. See Ezugwu et al., "Face Milling of Aerospace Materials", First International Conference on the Behavior of Materials in Machining, Stratford upon Avon, England (November 1988) pp. 3.1 through 3.11. Edge chipping most frequently occurs in the temperature range of between 600° C. and 800° C. See Chandrasekaran et al., "Role of Tool Microstructure and Stress-State upon Wear Mechanisms in Milling", Annals of the CIRP, Vol. 39, (1990), pp. 65–69.

Referring to the wear mechanism of edge chipping, cemented carbides begin to exhibit some plasticity at a temperature of about 550° C. See D. Mari and D. R. Gonseth, "A New Look at Carbide Tool Life", Wear, 165 (1993) 9. Above 550° C. cracks can initiate and grow in a less catastrophic manner than at a lower temperature where the cemented carbide behaves in a completely brittle manner. Milling of titanium and its alloys at greater speeds, which equates to higher temperatures of the cutting inserts, generates cyclic mechanical and thermal stresses that produce cracks which result in the microchipping of the cutting edge of the cutting insert. Thus, it becomes apparent that the resistance to mechanical crack propagation ($R_{MCP}$), i.e., mechanical shock, and the resistance to thermal crack initiation ($R_{TCI}$), i.e., thermal shock, are important mechanical properties for a substrate used in the milling of titanium and titanium alloys.

For a substrate material, the resistance to mechanical crack propagation ($R_{MCP}$) and the resistance to thermal crack initiation ($R_{TCI}$) are given by the following relationships:

$$R_{MCP}=(2\gamma E/\pi a)^{1/2}$$

$$R_{TCI}=k\sigma_t(1-\nu)/\alpha E$$

where $\gamma$ is the surface energy (joule per square meter) of the substrate; E is the modulus of elasticity (gigapascal [GPa]) of the substrate; a is a dimension of the maximum flaw size (micrometer [$\mu$m]) in the substrate; k is the thermal conductivity (Watt per meter kelvin [W/mK]) of the substrate, $\sigma_t$ is the maximum strength in tension taken as the transverse rupture strength (megapascal [MPa]) of the substrate; $\nu$ is Poisson's ratio of the substrate; and $\alpha$ is the thermal expansion coefficient ($10^{-6}$/K) of the substrate.

Nine compositions (Grades Nos. 1–9) were reviewed to identify those substrate compositions which would provide the better resistance to mechanical crack propagation ($R_{MCP}$) and the better resistance to thermal crack initiation ($R_{TCI}$). These nine compositions are described in Table I set forth hereinafter. The compositional aspects of Table I are expressed in terms of weight percent of the entire composition. The hardness is expressed in terms of Rockwell A. The coercive force is expressed in terms of Oersteds ($H_C$). The specific gravity is expressed in terms of grams per cubic centimeter (g/cm$^3$). The grain size is expressed in terms of micrometers ($\mu$m). The magnetic saturation is expressed in percent wherein 100 percent is equal to 202 microtesla cubic meter per kilograms ($\mu$Tm$^3$/kg)

TABLE I

Composition and Properties of Compositions Nos. 1–9

| Comp. No. | Co | Ta | Ti | Nb | Cr | WC | Hardness | Coercive Force ($H_C$) | Specific Gravity ($g/cm^3$) | Grain Size ($\mu m$) | Magnetic Saturation ($\mu Tm^3/kg$) |
|---|---|---|---|---|---|---|---|---|---|---|---|
| 1 | 6.0 | 0.1 | 0.1 | 0.1 | 0.4 | Bal. | 93 | 285 | 14.90 | 1–5 | 89 |
| 2 | 5.6 | 1.9 | 0.2 | 0.3 | — | Bal. | 92.7 | 265 | 14.95 | 1–4 | 92 |
| 3 | 6.0 | 3.4 | 0.5 | 0.3 | — | Bal. | 91.9 | 220 | 14.65 | 1–6 | 85 |
| 4 | 5.4 | 1.8 | 0.6 | 0.4 | — | Bal. | 92.1 | 225 | 14.85 | 1–6 | 93 |
| 5 | 11.5 | 1.8 | 0.4 | 0.4 | — | Bal. | 89.8 | 160 | 14.20 | 1–6 | 93 |
| 6 | 12.1 | 0.5 | 0.3 | 0.2 | — | Bal. | 88.0 | 105 | 14.20 | 1–8 | 92 |
| 7 | 10.0 | 0.4 | 0.3 | 0.1 | — | Bal. | 88.0 | 85 | 14.40 | 1–9 | 96 |
| 8 | 8.5 | 10.2 | 5.9 | 0.4 | — | Bal. | 91.2 | 140 | 12.65 | 1–8 | 94 |
| 9 | 9.0 | 0.5 | 0.4 | 0.2 | — | Bal. | 90.0 | 130 | 14.45 | 1–10 | 93 |

Table II below presents the physical-mechanical properties used to make the calculations set out in Table III.

TABLE II

Selected Physical Properties for Grades Nos. 1–9

| Grade | Surface Energy (joule/$m^2$) | Modulus of Elasticity (GPa) | Dimension of Max. Flaw Size ($\mu m$) | Thermal Conductivity (W/mK) | Transverse Rupture strength (MPa) | Poisson's Ratio | Thermal Expansion Coefficient ($10^{-6}$/K) |
|---|---|---|---|---|---|---|---|
| 1 | 715 | 615 | 10 | 79 | 3000 | 0.3 | 5.3 |
| 2 | 693 | 612 | 10 | 86 | 2000 | 0.3 | 6.5 |
| 3 | 707 | 613 | 10 | 91.2 | 1990 | 0.3 | 5.3 |
| 4 | 607 | 624 | 10 | 79 | 2100 | 0.3 | 5.4 |
| 5 | 649 | 550 | 10 | 67.4 | 2610 | 0.3 | 5.3 |
| 6 | 596 | 551 | 10 | 90.8 | 2710 | 0.3 | 5.8 |
| 7 | 586 | 565 | 10 | 99 | 2700 | 0.3 | 5.5 |
| 8 | 665 | 511 | 10 | 44.8 | 2170 | 0.3 | 6.45 |
| 9 | 623 | 574 | 10 | 99.6 | 2210 | 0.3 | 5.8 |

Referring to diffusion wear (or cratering), this a wear mechanism which exists in the milling of titanium and titanium alloys. In this mechanism, there occurs the diffusion of elements of the cutting insert into the chip as it moves over the surface of the cutting insert. Further discussion of this mechanism is set forth in a pending U.S. patent application Ser. No. 08/798,886 (filed on Feb. 11, 1997) [a file wrapper continuation of U.S. Ser. No. 08/572,231 filed Dec. 13, 1995] for CUTTING TOOL FOR MACHINING TITANIUM AND TITANIUM ALLOYS by Bryant. The above-mentioned U.S. patent application Ser. No. 08/798,886 that issued as U.S. Pat. No. 5,918,541 on Feb. 17, 1998 is hereby incorporated by reference herein.

The resistance to cratering ($R_{CR}$) is proportional to the diffusion resistance ($R_D$) for each of the Grades Nos. 1–9 when coated with a PVD tungsten carbide coating. Because the coating (i.e. PVD tungsten carbide) is the same for all of the samples composition Nos. 1–9), the resistance to cratering ($R_{CR}$) will be the same for all of the samples. Thus, there is no necessity to set out a quantitative measure of the resistance to cratering ($R_{CR}$) when determining the relative ranking of the samples.

Nose deformation is another factor to consider in the milling of titanium and titanium alloys due to the high cutting insert temperatures. The deformation resistance ($R_{DEF}$) is best expressed as 0.2 offset compressive yield strength at 1000° C. (MPa).

Table III set forth below presents the calculated resistance to mechanical crack propagation ($R_{MCP}$), the calculated resistance to thermal crack initiation ($R_{TCI}$), the resistance to deformation ($R_{DEF}$) as a 0.2 offset compressive yield strength at 1000° C., and the relative ranking measure of wear resistance.

TABLE III

Calculated Resistance to Mechanical Crack Propagation ($R_{MCP}$), Calculated Resistance to Thermal Crack Initiation ($R_{TCI}$), Resistance to Deformation ($R_{DEF}$), and Relative Ranking Measure of Wear Resistance

| Grade No. | $R_{MCP}$ | $R_{TCI}$ (× $10^{-7}$) | $R_{DEF}$ (MPa) | $10^2$ × Relative Ranking Measure |
|---|---|---|---|---|
| 1 | 168 | 4.68 | 1206 | 9.48 |
| 2 | 164 | 3.52 | 1030 | 5.95 |
| 3 | 166 | 3.91 | 922 | 5.98 |
| 4 | 166 | 3.44 | 920 | 5.25 |
| 5 | 149 | 4.22 | 657 | 4.13 |
| 6 | 144 | 5.38 | 450 (estimated) | 3.49 |
| 7 | 145 | 6.02 | 400 (estimated) | 3.49 |
| 8 | 147 | 2.06 | 1030 | 3.12 |
| 9 | 151 | 4.54 | 400 (estimated) | 2.74 |

The relative ranking measure is representative of the total wear resistance (WR=$R_{MCP}{}^a \cdot R_{TCI}{}^b \cdot R_{CR}{}^c \cdot R_{DEF}{}^d$) for Grades Nos. 1–9 where a, b, c and d are considered to equal one. The relative ranking measure is the product of the resistance to mechanical crack propagation ($R_{MCP}$), the calculated resistance to thermal crack initiation ($R_{TCI}$) and the resistance to deformation ($R_{DEF}$).

It is apparent that Grade No. 1 provides the far better wear resistance for the milling of titanium and its alloys than the other substrates. When Grade No. 1 has a PVD tungsten carbide coating it is apparent that it should be an excellent cutting insert. It is also apparent that a cutting insert comprising a substrate with a tip brazed thereto wherein the tip has the composition of Grade No. 1 and a PVD tungsten carbide coating applied thereto should be an excellent cutting tool. It is further apparent that a cutting insert comprising a substrate with a tip brazed thereto wherein the substrate and the tip have the composition of Grade No. 1 and a PVD tungsten carbide coating is applied to the tip and at least a portion of the substrate which comes into contact with the workpiece during milling should be an excellent cutting tool.

The patents and other documents identified herein are hereby incorporated by reference herein.

Other embodiments of the invention will be apparent to those skilled in the art from a consideration of the specification or practice of the invention disclosed herein. It is intended that the specification and examples be considered as illustrative only, with the true scope and spirit of the invention being indicated by the following claims.

What is claimed is:

1. A cutting tool for milling titanium and titanium alloys comprising:
    a substrate comprising tungsten carbide and cobalt, and the substrate further including cobalt in the range of between 5.7 to 6.3 weight percent and chromium in the range of between 0.3 and 0.5 weight percent; and
    a coating of tungsten carbide applied to the substrate by physical vapor deposition.

2. The cutting tool of claim 1 wherein the substrate further includes up to 0.1 weight percent tantalum; up to 0.1 weight percent titanium, and up to 0.1 weight percent niobium.

3. The cutting tool of claim 1 wherein the substrate has a hardness of between 92.6 and 93.4 Rockwell A, a coercive force of between 250 and 320 oersteds, a specific gravity of 14.80 to 15.00 g/cm$^3$, and a WC grain size of 1 to 5 micrometers.

4. The cutting tool of claim 1 wherein the calculated relative ranking measure of wear resistance of the cutting tool when milling titanium and titanium alloys is at least $6.0 \times 10^2$.

5. The cutting tool of claim 1 wherein the calculated relative ranking measure of wear resistance of the cutting tool when milling titanium and titanium alloys is about $9.48 \times 10^2$.

6. A cutting tool for milling titanium and titanium alloys comprising:
    a substrate comprising tungsten carbide and cobalt wherein the cobalt ranges between 5.7 and 6.3 weight percent;
    a tip brazed to the substrate; and
    a coating of tungsten carbide applied by physical vapor deposition to the tip.

7. The cutting tool of claim 6 wherein the substrate further includes up to 0.1 weight percent tantalum; up to 0.1 weight percent titanium, up to 0.1 weight percent niobium, and chromium in the range of between 0.3 weight percent and 0.5 weight percent.

8. The cutting tool of claim 6 wherein the substrate has a hardness of between 92.6 and 93.4 Rockwell A, a coercive force of between 250 and 320 oersteds, a specific gravity of 14.80 to 15.00 g/cm$^3$, and a WC grain size of 1 to 5 micrometers.

9. The cutting tool of claim 6 wherein the tip comprises tungsten carbide.

10. The cutting tool of claim 6 further including a coating of PVD tungsten carbide applied to at least a portion of the substrate.

11. The cutting tool of claim 6 wherein the substrate contacts a braze and the coating contacts the tip.

12. The cutting tool of claim 6 wherein the substrate contacts a braze, the braze contacts the tip and the coating contacts the tip.

13. The cutting tool of claim 6 wherein the tip comprises tungsten carbide and between 5.7 and 6.3 weight percent cobalt.

14. The cutting tool of claim 13 wherein the tip further includes up to 0.1 weight percent tantalum; up to 0.1 weight percent titanium, up to 0.1 weight percent niobium, and chromium in the range of between 0.3 weight percent and 0.5 weight percent.

15. The cutting tool of claim 13 wherein the tip has a hardness of between 92.6 and 93.4 Rockwell A, a coercive force of between 250 and 320 oersteds, a specific gravity of 14.80 to 15.00 g/cm$^3$, and a WC grain size of 1 to 5 micrometers.

16. The cutting tool of claim 13 wherein the calculated relative ranking measure of wear resistance of the tip when milling titanium and titanium alloys is at least $6.0 \times 10^2$.

17. A cutting tool for milling titanium and titanium alloys comprising:
    a substrate comprising tungsten carbide and cobalt wherein the cobalt ranges between 5.7 and 6.3 weight percent; and
    a tip brazed to the substrate wherein the tip comprises PVD tungsten carbide.

18. The cutting tool of claim 17 wherein the substrate further includes up to 0.1 weight percent tantalum; up to 0.1 weight percent titanium, up to 0.1 weight percent niobium, and chromium in the range of between 0.3 weight percent and 0.5 weight percent.

19. The cutting tool of claim 17 wherein the substrate has a hardness of between 92.6 and 93.4 Rockwell A, a coercive force of between 250 and 320 oersteds, a specific gravity of 14.80 to 15.00 g/cm$^3$, and a WC grain size of 1 to 5 micrometers.

20. The cutting tool of claim 17 wherein a PVD tungsten carbide coating is applied to at least a portion of the substrate.

* * * * *